United States Patent
Tachibana et al.

(10) Patent No.: US 6,957,136 B2
(45) Date of Patent: Oct. 18, 2005

(54) APPARATUS FOR REWRITING A MEMORY IN A VEHICLE MOUNTED ECU THROUGH COMMUNICATIONS

(75) Inventors: Ken Tachibana, Hyogo (JP); Ikuo Musa, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/299,787

(22) Filed: Nov. 20, 2002

(65) Prior Publication Data

US 2004/0002793 A1    Jan. 1, 2004

(30) Foreign Application Priority Data

Jun. 27, 2002    (JP) .............................. 2002-187581

(51) Int. Cl.⁷ .......................... G06F 19/00; G06F 17/00
(52) U.S. Cl. ..................... 701/35; 701/32; 340/426.14; 711/155; 711/156; 248/551
(58) Field of Search .............................. 701/1, 29, 32, 701/33, 35, 115; 340/426.14; 711/155, 156, 711/103, 164; 248/551

(56) References Cited

U.S. PATENT DOCUMENTS 6,127,947 A * 10/2000 Uchida et al. .............. 340/999
6,230,082 B1 * 5/2001 Harada et al. ................. 701/1
6,285,948 B1 * 9/2001 Takagi et al. ............... 701/115
2001/0002814 A1 * 6/2001 Suganuma et al. ........ 340/5.74
2003/0009271 A1 * 1/2003 Akiyama ..................... 701/33
2003/0050747 A1 * 3/2003 Kamiya ....................... 701/33

FOREIGN PATENT DOCUMENTS

JP          11-143720          5/1999

* cited by examiner

Primary Examiner—Thomas G. Black
Assistant Examiner—Ronnie Mancho
(74) Attorney, Agent, or Firm—Sughrue Mion, PLLC (57) ABSTRACT

A memory rewriting apparatus can rewrite control programs for a vehicle mounted ECU through communications reliably and easily. A transmission and reception circuit communicates with a data communications device that sends program data. An ID check circuit checks based on an ID check code attached to the data whether a subject vehicle on which the apparatus is installed is a vehicle to be rewritten. A communications condition determination device determines whether the communications condition is suitable for communications. A control part (MPU) controls writing program data into a memory of the vehicle mounted ECU. The control part notifies the non-completion of rewriting to the data communications device when determined, before and during data rewriting, that the communications condition is unsuitable, and it also notifies the completion of rewriting to the data communications device after the rewriting of the data has been completed, when determined that the communications condition is suitable.

10 Claims, 5 Drawing Sheets

APPARATUS FOR REWRITING A MEMORY IN A VEHICLE MOUNTED ECU THROUGH COMMUNICATIONS

BACKGROUND OF THE INVENTION

1. Field of the Invention

The present invention relates to an apparatus for rewriting a memory in a vehicle mounted ECU (Electronic Control Unit) through communications in order to allow a control program for the vehicle mounted ECU to be changed with ease.

2. Description of the Related Art

Recently, a lot of ECUs have come to be installed in vehicles such as motor vehicles in the background of the advancement of electronic technologies, especially the microcomputer application technology. For instance, such ECUs include engine control ECUs, transmission control ECUs (hereinafter called A/T ECUs), navigation ECUs, etc.

In the microcomputers of these ECUs, "control data" and "control programs" that seem to be optimal at the stage of development are stored. For instance, the following data are stored in the engine control ECUs.

Drive timing control data for continuously variable valve timing device (WT) (for improvement in engine power).

Air/fuel ratio control data (for further cleaning exhaust gases).

Ignition timing data (for improvement in engine power).

Control programs for controlling the engine and transmission by using the above data.

In addition, in the navigation ECUs there are stored navigation data and programs such as "map data", "route searching programs", and the like.

However, more optimal data and more suitable control programs than those at the stage of the initial development might be obtained by performing the review of data, control logic, etc., for these control ECUs even after they have been produced after the completion of their developments. In this case, it is extremely difficult to change the programs in the ECUs that came onto the market after their manufacture. That is, it is very time-consuming work that the vehicles having these ECUs installed thereon are recalled and subjected to the rewriting of their memories one by one after these products have been manufactured. Therefore, fresh or new data cannot be used for the vehicles of the initial type or model which have already been manufactured, and the new data are installed only on the vehicles which have been subjected to minor changes and later on. As a result, there will arise a problem that the vehicles with control data of the old models installed thereon, which are of quite the same in hardware as those of new models, can not enjoy the advantages of the latest data in respect of fuel cost, emission control measures, environmental preservation, etc.

In view of the above problem, it is thought that programs are made to be upgraded through communications. For such a technique, reference is made to Japanese patent application laid-open No. Hei 11-143720 as one example of an invention related to the upgrade of audio-related ECUs through communications. This prior art document describes a method in which communications are permitted by pressing a hidden command button for the upgrade of an ECU, so that upgrading is executed through radio communications. However, this prior art method involves another problem that an operator has to take the trouble of pressing the hidden command button of the vehicle to be rewritten and that no measure is taken for the case where there take place poor communications such as malfunctions, etc., due to noise during communications. Moreover, no means is mentioned for distinguishing the environments where trouble might occur while communicating, so it is impossible to prevent communication failures.

In addition, when the data stored in the ECU is rewritten, an electric malfunction, the destruction of communication signals or the like might be caused due to reduction in the battery voltage or by driver's operation of the key switch which might induce such battery voltage reduction. Further, the vehicle would be subjected to various external disturbances while travelling so that normal data communications might be obstructed occasionally.

SUMMARY OF THE INVENTION

The present invention has been made in view of the above-mentioned circumstances, and has for its object to provide an apparatus for rewriting a memory in a vehicle mounted ECU through communications, in which the rewriting of programs in the vehicle mounted ECU through communications can be performed in an easy and reliable manner.

Here, note that it is needless to say that rewriting the programs in the vehicle mounted ECU through communications includes not only upgrading but also rewriting the existing programs into programs for other types of vehicles or into programs for other functions.

Bearing the above object in mind, the present invention resides in an apparatus for rewriting a memory in a vehicle mounted ECU through communications, the apparatus including: a transmission and reception circuit for performing data communications with a data communications device which sends program data; an ID check circuit for checking based on an ID check code attached to the program data whether a subject vehicle on which the apparatus is installed is a vehicle to be rewritten; a communications condition determination device for determining whether the present condition of communications is suitable for communications with the data communications device; and a control part for performing writing control in such a manner that when it is determined based on an output from the ID check circuit that the subject vehicle is a vehicle to be rewritten, the program data received by the transmission and reception circuit is written into the memory in the vehicle mounted ECU. The control part notifies the non-completion of rewriting to the data communications device when the communications condition determination device determines, before and during data rewriting, that the present condition of communications is unsuitable for communications, and it also notifies the completion of rewriting to the data communications device after the rewriting of the data has been completed, when it is determined that the present condition of communications is suitable for communications.

According the memory rewriting apparatus as constructed above, the state of a vehicle in the course of software upgrading is always monitored so that the completion or non-completion of communications can be checked from the data communications device side. As a result, the upgrading of control programs for the vehicle mounted equipment can be carried out in a reliable and easy manner.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Hereinafter, preferred embodiments of the present invention will be described in detail while referring to the accompanying drawings.

Embodiment 1.

Figure 1:
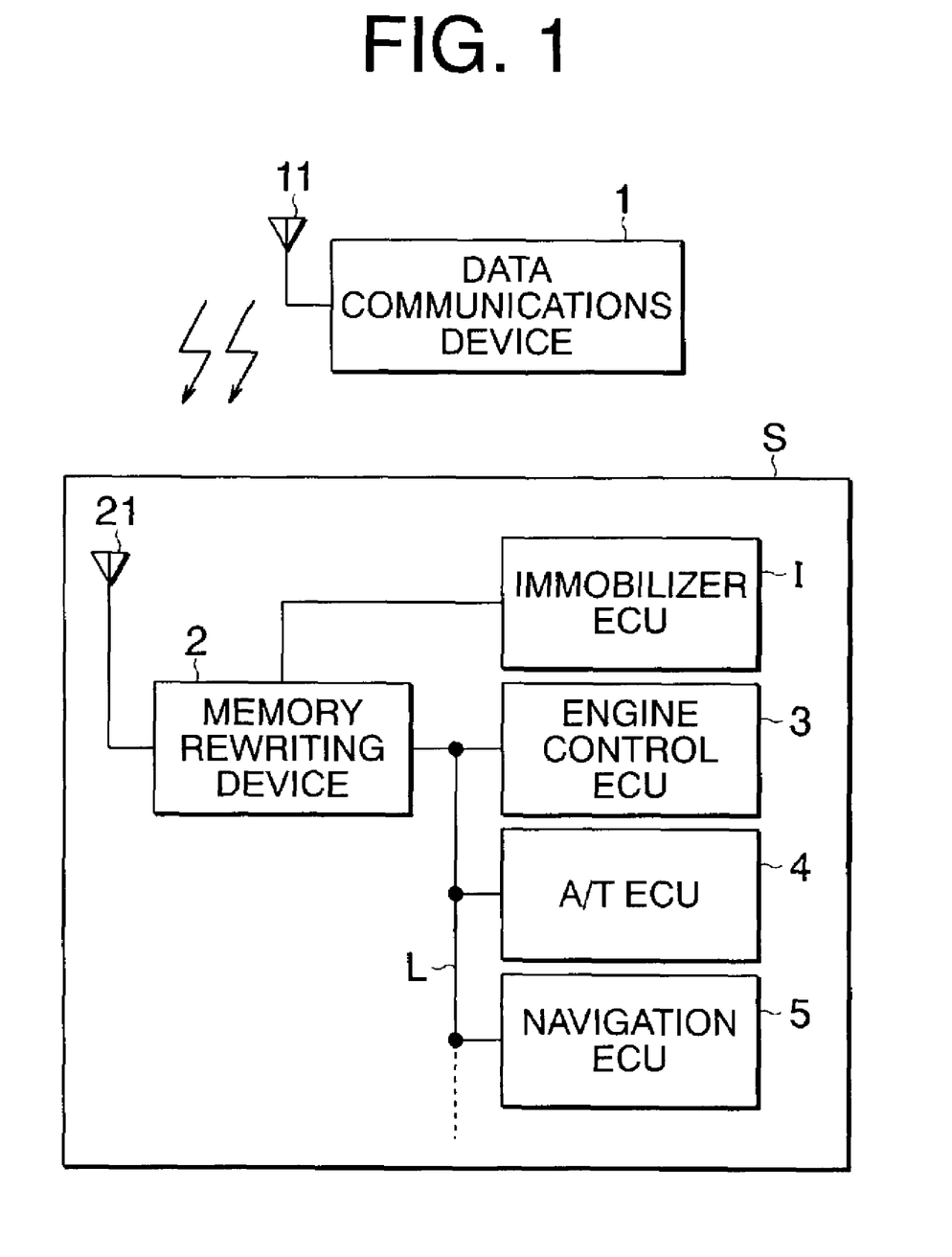
FIG. 1 is a block diagram showing the configuration of an entire system S including an apparatus for rewriting a memory through communications according to a first embodiment of the present invention.

FIG. 1 is a view illustrating the configuration of an entire system including a memory rewriting apparatus in accordance with a first embodiment of the present invention. In FIG. 1, a reference numeral 1 designates a data communications device connected with an antenna 11, and a reference symbol S generally designates an entire system including a memory rewriting apparatus 2 mounted on a vehicle according to the present invention. The system S includes, in addition to the memory rewriting apparatus 2, an anti-theft device ECU I (also called an immobilizer ECU in the drawings), an engine control ECU 3, a transmission control (A/T) ECU 4, a navigation ECU 5, and a bus connecting between the various ECUs for achieving the rewriting of memories by means of the memory rewriting apparatus 2. The memory rewriting apparatus 2 has an antenna 21 for communication with the antenna 11 of the data communications device 1.

Figure 2:
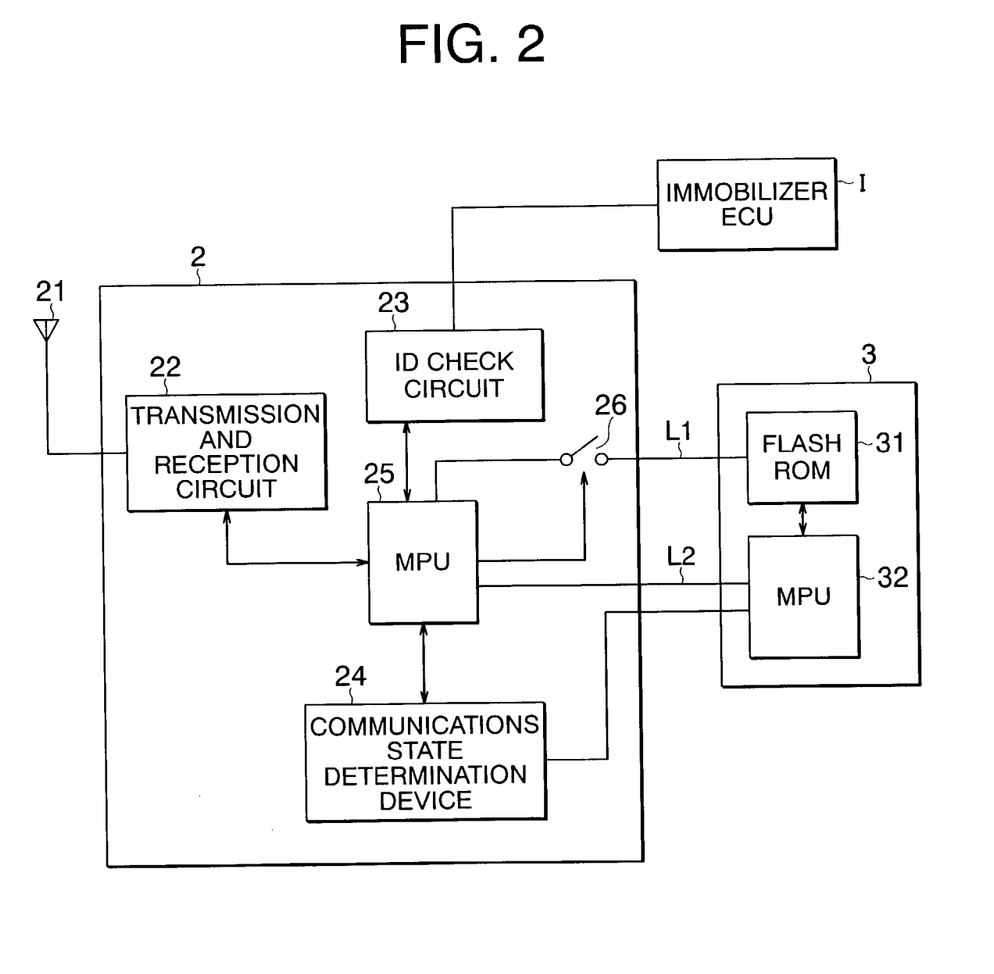
FIG. 2 is a view showing the internal configuration of the memory rewriting apparatus 2, and explaining the procedure for upgrading a control program for either one of vehicle mounted ECUs in the system S of FIG. 1, while taking an engine control ECU 3 as an example.

FIG. 2 is a view showing the internal configuration of the memory rewriting apparatus 2, as well as explaining the procedure for upgrading a control program for either one of a plurality of pieces of vehicle mounted equipment in the system S of FIG. 1, while taking the engine control ECU 3 as an example. First of all, in FIG. 1, upgrade program data for rewriting is sent from the data communications device 1 through the antenna 11, and the vehicle system S equipped with the memory rewriting apparatus 2 of the present invention receives the upgrade program data through the antenna 21.

Then, as shown in FIG. 2, the upgrade program data is received by a transmission and reception circuit 22 in the memory rewriting apparatus 2. Now, reference will be made to the operation, mainly, of an MPU 25 that constitutes a control means in the memory rewriting apparatus 2 while referring to a flow chart shown in FIG. 3. An ID check code indicating a vehicle to be upgraded is attached to the upgrade data received by the memory rewriting apparatus 2, and an ID check circuit 23 checks the ID check code (step 300). This code is identical to that ID check code specific to a vehicle to be upgraded, which is used by the immobilizer ECU I. The ID check circuit 23 checks the code attached to the received data by collating it with the ID code specific to the subject vehicle on which the memory rewriting apparatus 2 is installed, and determines whether the subject vehicle is a vehicle to be rewritten (step 301).

When it is determined that the subject vehicle is a vehicle to be rewritten, the microcomputer (MPU) 25 in the memory rewriting apparatus 2 sends a signal for instructing the setting of a writing mode to a microcomputer (MPU) 32 in the form of an upgrade MPU in the engine control ECU 3 through a control line L2. In addition, the microcomputer 25 turns on a selector switch 26 for connection so that the data received through the antenna 21 and the transmission and reception circuit 22 can be directed to a data line L1.

Thus, the new control program data for the engine control ECU 3 sent from the data communications device 1 is written into a flash ROM 31 in the engine control ECU 3 through the antenna 21, the transmission and reception circuit 22, the switch 26 and the data line L1.

Figure 3:
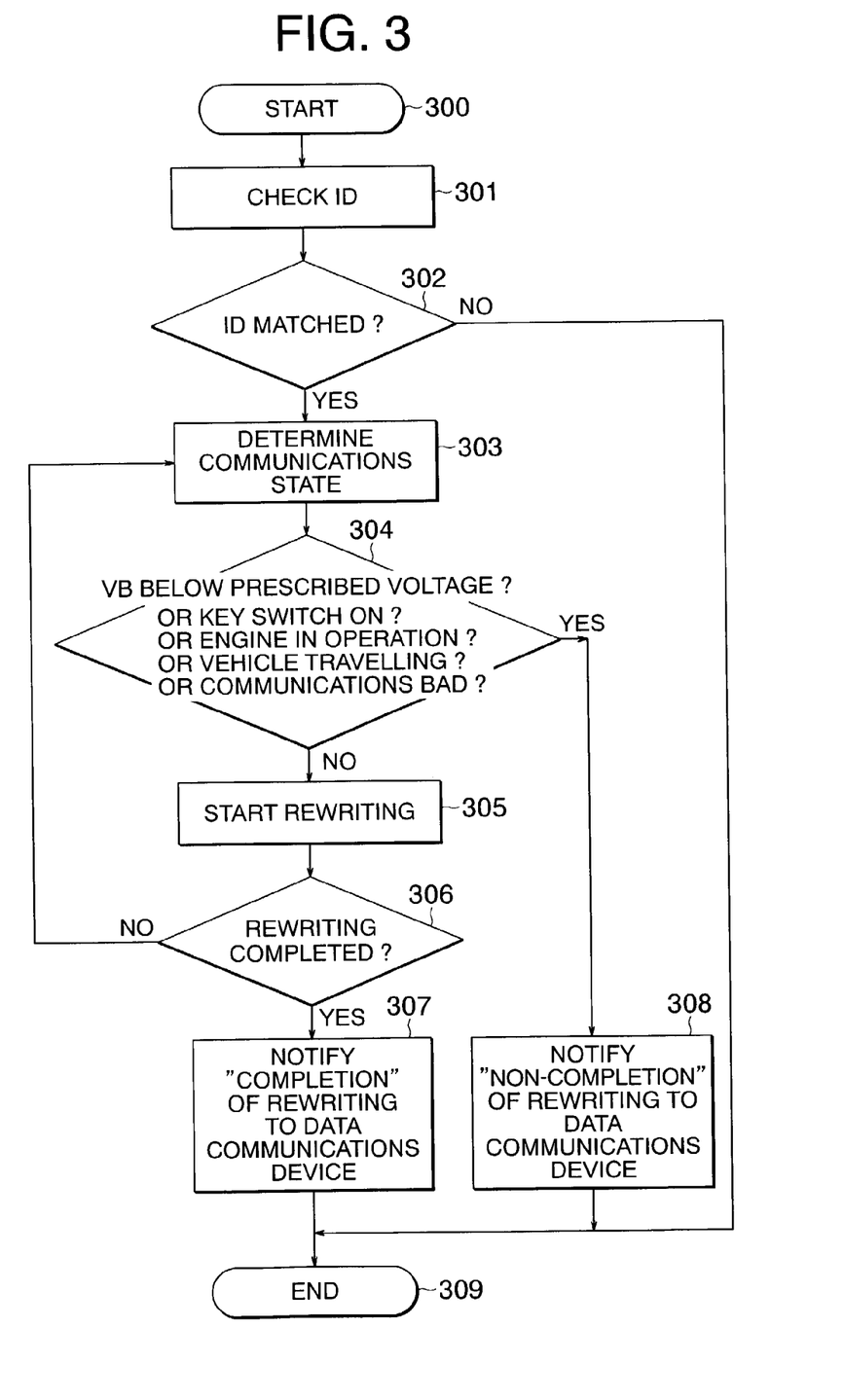
FIG. 3 is a flow chart explaining the operation of each component part in the memory rewriting apparatus 2 of FIG. 2.

During rewriting of the data, a communications condition determination device 24 determines whether the present communications condition is suitable for data communications (step 303). When it is determined in step 304 that the present communications condition is not suitable for data communications (that is, the battery voltage is below a predetermined voltage, or the key switch is on, or the engine is being driven to operate, or the vehicle is travelling, or the starter switch is on, or communications are bad), the microcomputer 25 turns off the connection of the selector switch 26 to discontinue rewriting the data.

That is, this serves to deal with the following situations.

In cases where the battery voltage is reduced below a predetermined value due to a deterioration of the battery, charge shortage, overcharge, engine starting, or a failure of the generator, there might be caused defective operations of the ECUs, a malfunction of the transmission and reception circuit, or the like. To avoid communications failure in such a case, it is useful to monitor the battery voltage and permit communications only when the battery voltage exceeds the predetermined value.

When the key switch is on, there is a high possibility that the vehicle is going to be or has already been driven to run, including a state in which the engine is being driven to operate. In this case, such a possibility can be avoided or excluded by prohibiting the rewriting of data when the key switch is on at which the battery voltage might be reduced due to engine starting operation, or the state of communications might be deteriorated due to the movement of the vehicle.

Although there is a possibility that during the operation of the engine, which can be detected or recognized by a signal representative of the number of revolutions per minute of the engine, external disturbances such as engine noise might be generated, or the communications condition might be deteriorated due to the movement of the vehicle, it is possible to prevent communications failure resulting from the movement of the vehicle by prohibiting communications during engine operation.

Although there arises a possibility that the communications condition might be deteriorated due to the movement of the vehicle, which can be detected or recognized by the rotation of the wheels, it is possible to prevent communications failure due to the movement of the vehicle by prohibiting communications while the vehicle is traveling.

Since the starter is rotated to start the engine when the starter switch is on, there is a possibility that the resultant power consumption might reduce the battery voltage, thus causing the ECUs and the transmission and reception circuit to malfunction. However, this can be avoided by prohibiting communications while the starter switch is on.

Then, the "non-completion of rewriting" is notified to the data communications device 1 through the transmission and reception circuit 22 (step 308). On the other hand, the rewriting of the data is continued as it is when there are no poor or bad communications (step 305). After completion of the rewriting, the microcomputer 25 notifies the "completion of rewriting" to the data communications device 1 through the transmission and reception circuit 22 that functions to switch over the selector switch 26 into its off state (step 306→step 307).

Thus, according to the first embodiment, upgrading the vehicle mounted ECUs through communications can be performed in an easy and reliable manner.

Embodiment 2.

Although in the above-mentioned first embodiment, the MPU 32 in the engine control ECU 3 is made as an MPU to be upgraded, memory rewriting can be carried out by replacing that MPU with an MPU of any ECU having a memory in which program data is stored, such as the A/T ECU 4, the navigation ECU 5, and the immobilizer ECU I as shown in FIG. 1, or by replacing it with an MPU of any of other vehicle mounted ECUs. The concrete operational procedures for such upgrading are omitted since they are similar to the upgrading procedure according to the first embodiment as shown in FIG. 3.

Embodiment 3.

Figure 4:
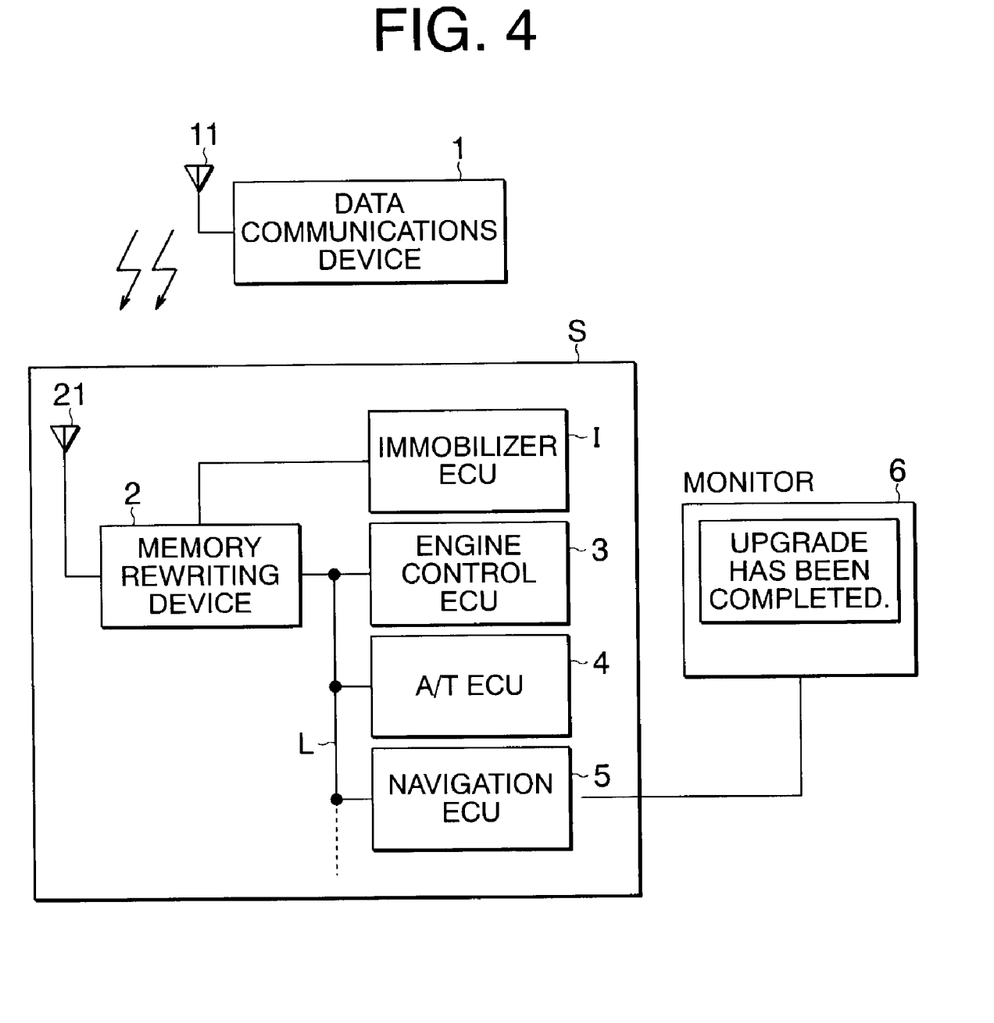
FIG. 4 is a block diagram illustrating the configuration of a memory rewriting apparatus according to a third embodiment of the present invention.

FIG. 4 is a view illustrating a system configuration according to a third embodiment of the present invention. In FIG. 4, the same or corresponding parts of this embodiment as those of the first embodiment shown in FIG. 1 are identified by the same symbols while omitting an explanation thereof. This third embodiment includes, as a new component, an information means in the form of a monitor 6 connected to the navigation ECU 5.

Figure 5:
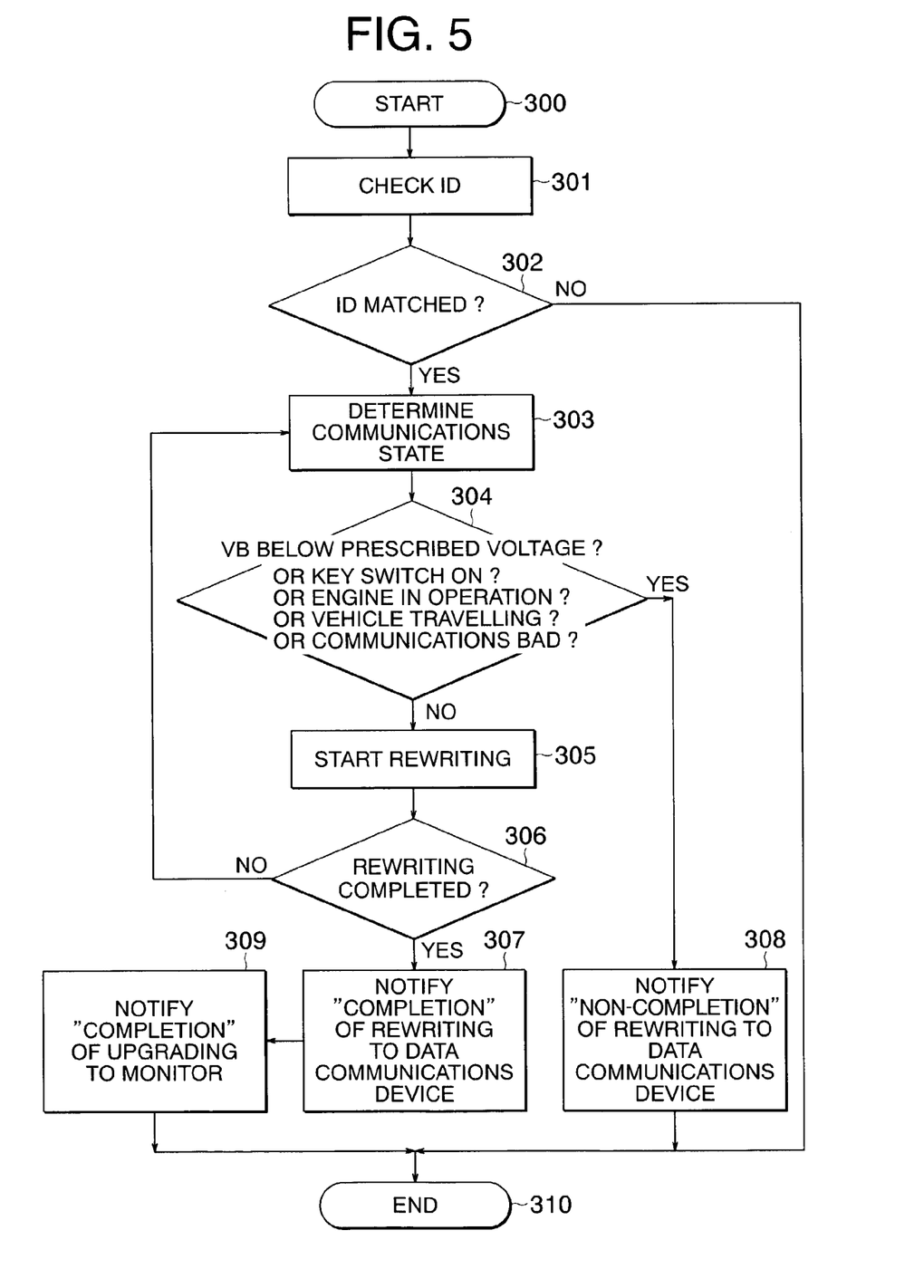
FIG. 5 is a flow chart illustrating the operation of each component part of the memory rewriting apparatus according to the third embodiment.

Hereinafter, the operation of the memory rewriting apparatus 2 according to the third embodiment will be described referring to a flow chart shown in FIG. 5. The flow chart shown in FIG. 5 is different from that shown in FIG. 3 in that after having notified the "completion of rewriting" to the data communications device 1 through the transmission and reception circuit 22 (step 307), the MPU 25 notifies the "completion" of upgrading to the monitor 6 (step 307→step 309).

In case of a vehicle with a display function such as a navigation screen or the like, a user can recognize that upgrading has been performed, by displaying an indication such as, for example, "The control program of the ○○ ECU has been upgraded." when the user turned on the power supply for the monitor 6. In addition, it is preferable that when rewriting has not yet been completed, no such an indication is displayed on the monitor screen. Thus, it is possible to avoid putting unnecessary worry on the user, and it is also possible for the data communications device 1 side to check or confirm the state of unsuitable communications such as bad or poor communications, so that other appropriate measures may be taken for the vehicles for which communications are unsuitable.

Embodiment 4.

In the above-mentioned respective embodiments, when the communications condition determination device 24 detects any of the following conditions (that is, the battery voltage is below the predetermined voltage; the key switch is on; the engine is being driven to operate; the vehicle is travelling; the starter switch is on; and communications are bad), the microcomputer 25 turns off the connection of the selector switch 26 to discontinue rewriting data, and notifies the "non-completion of rewriting" to the data communications device 1 through the transmission and reception circuit 22, but provision may instead be made for a counter or the like that measures a predetermined period of time so as to prohibit or interrupt the memory rewriting from the detection of the bad or defective communications until the predetermined period of time has elapsed. In this case, the upgrading of a control program can be executed in a safer and more reliable manner after the communications condition has been recovered.

Although in the above-mentioned respective embodiments, radio communications are used for data communications, the present invention is not limited to the data communications through radio communications, but can of course be applied to the cases where data communications are made by the use of other wireless or wired communications means than radio communications, such as optical communications, etc.

As described above, according to the present invention, the state of the vehicle in the course of software upgrading can always be monitored to allow the data communications device side to check or confirm the completion or non-completion of communications, whereby the upgrading of control programs for the vehicle mounted equipment can be executed reliably and easily. Concretely, the following advantageous effects are achieved.

(1) Since software upgrading can be easily performed if electric power is supplied to the memory rewriting apparatus 2 and the engine control ECU 3, when data is corrected immediately before the shipment of the apparatus, etc., the correction of the data for all the ECUs to be upgraded will be able to be made at once if the registration of IDs of ECUs is grouped for each vehicle type or model.

(2) Since upgrading can be made with the latest and optimal data even for vehicles that have already come onto the market, it is possible to satisfy users because their control programs and data can always be kept up to date, and if the data is changed in a sense to clean the exhaust gases from their vehicles, it will lead to the environmental protection of the earth.

(3) Since the vehicle to be rewritten is checked or confirmed by ID check, and rewriting is executed through communications, it is not necessary for an operator to directly visit the place where the vehicle to be rewritten is located or kept, but rewriting can be easily carried out even if the vehicle would be placed under severe environments such as, for example, in the snow. In other words, it becomes unnecessary to do works themselves such as movement of the vehicle for rewriting or operator's coming to the work place to do wiring arrangements or connections, thus making it possible to reduce labor costs as well as the total time of working in a considerable extent.

(4) Since a data rewriting check ID is set to the same code as the ID code of an anti-theft device mounted on each vehicle, if the vehicle numbers are administered on the host side, the data of a specific vehicle alone can be individually changed, thus providing the following advantageous effects.

Program changes (e.g., valuing fuel costs, output power, etc.) according to individual users' favorites can be made as desired by the users.

As in the case of a vehicle being stolen, a engine stopping program is sent to the engine control ECU of the stolen vehicle after checking the ID code of the anti-theft device installed on the stolen vehicle, whereby the rewriting of the program in the engine control ECU is executed at the spot. For instance, the engine of the stolen vehicle during traveling can be stalled or made unable to be restarted by gradually cutting off the fuel supplied to engine cylinders one by one, thus making it possible to stop the vehicle in a safe manner.

Incidentally, in cases where the data rewriting check ID is communicated to the respective ECUs of the stolen vehicle through an in-vehicle LAN installed therein, if an ID is allocated to an ECU for the centralized control of the in-vehicle LAN, rewriting the program data for all the vehicle mounted ECUs becomes possible by the use of one ID per vehicle. In this case, that one ECU can be used as a transmission and reception ECU.

As described in the foregoing, the present invention provides the following excellent advantages.

According to the present invention, the state of a vehicle in the course of software upgrading is always monitored so that the completion or non-completion of communications can be checked from the data communications device side. As a result, the upgrading of control programs for the vehicle mounted equipment can be carried out in a reliable and easy manner.

Preferably, the communications condition determination device determines whether the battery voltage is equal to or lower than a predetermined voltage. Thus, by prohibiting data rewriting under the situation where the battery voltage is equal to or lower than the predetermined value, it is possible to avoid communications failure due to the data rewriting in the state of the reduced battery voltage.

Preferably, the communications condition determination device determines whether the key switch is on. Thus, by prohibiting data rewriting when the key switch is on, it is possible to avoid the data rewriting under the situation in which voltage variations are expected to occur such as during poor or bad communications in the course of rewriting (for instance, immediately before engine starting, or in a state in which an electrical load such as an audio player or the like is applied to the battery with the key switch being on), which could be generated when the key switch is on.

Preferably, the communications condition determination device determines whether the engine is in operation. Thus, by prohibiting data rewriting during driving of the engine, it is possible to avoid the data rewriting under the situation where communications failure will take place due to the generation of external disturbances such as engine noise, etc., or due to the movement of the vehicle.

Preferably, the communications condition determination device determines whether the vehicle is traveling. Thus, by prohibiting data rewriting when the vehicle is traveling, it is possible to avoid the data rewriting under the situation where external disturbances or voltage variations such as electric load variations might be generated according to the traveling state of the vehicle, or the vehicle might be moved to a place where it is subjected to communications failure.

Preferably, the communications condition determination device determines whether the starter switch is on. Thus, by prohibiting data rewriting when the starter switch is on, it is possible to avoid the data rewriting under the situation where malfunctions of the ECUs or the transmission and reception circuit might be caused due to reduction in the battery voltage when the starter switch is on.

Preferably, the communications condition determination device determines whether the communications condition is bad. Thus, by prohibiting data rewriting when the communications condition is bad, it is possible to avoid the data rewriting under a bad communications condition where radio waves would be interrupted or could not be reached.

In addition, all the control programs of the vehicle mounted ECUs can be upgraded in a reliable and easy manner.

Moreover, when data rewriting has been completed, the upgrading of the data is informed to the user by the information means, whereby it is possible to notify the execution of the data rewriting and the completion of the upgrading to the user.

Preferably, memory rewriting is prohibited or interrupted until a predetermined period of time has elapsed after it is determined that the communications condition is bad. As a result, the upgrading of control programs can be executed in a safer and more reliable manner.

Preferably, the correction of the data for all the ECUs to be upgraded will be able to be made at once if the registration of IDs of the ECUs is grouped for each vehicle type or model.

Preferably, a data rewriting check ID is set to the same code as the ID code of an anti-theft device mounted on each vehicle. Thus, if the vehicle numbers are administered on the host side, it is possible to change the data for a specific vehicle alone.

While the invention has been described in terms of preferred embodiments, those skilled in the art will recognize that the invention can be practiced with modifications within the spirit and scope of the appended claims.

What is claimed is:

1. An apparatus for rewriting a memory in a vehicle mounted ECU (Electronic Control Unit) through communications, said apparatus comprising:
   a transmission and reception circuit for performing data communications with a data communications device which sends program data;
   an ID check circuit for checking based on an ID check code attached to said program data whether a subject vehicle on which said apparatus is installed is a vehicle to be rewritten;
   a communications condition determination device for determining whether the present condition of communications is suitable for communications with said data communications device; and
   control means for performing writing control in such a manner that when it is determined based on an output from said ID check circuit that the subject vehicle is a vehicle to be rewritten, the program data received by said transmission and reception circuit is written into the memory in said vehicle mounted ECU, said control means being operable to notify the non-completion of rewriting to said data communications device when said communications condition determination device determines, before and during data rewriting, that the present condition of communications is unsuitable for communications, and also to notify the completion of rewriting to said data communications device after the rewriting of the data has been completed, when it is determined that the present condition of communications is suitable for communications,
   wherein the ID for data rewriting check is set to the same code as an ID code of an anti-theft device mounted on said subject vehicle.

2. The apparatus for rewriting a memory in a vehicle mounted ECU through communications according to claim 1, wherein when the voltage of a battery mounted on said subject vehicle is equal to or lower that predetermined value, said communications condition determination device determines that the present condition of communications is unsuitable for communications.

3. The apparatus for rewriting a memory in a vehicle mounted ECU through communications according to claim 1, wherein when an engine of said subject vehicle is in operation, said communications condition determination device determines that the present condition of communications is unsuitable for communications.

4. The apparatus for rewriting a memory in a vehicle mounted ECU through communications according to claim 1, wherein when said subject vehicle is traveling, said communications condition determination device determines that the present condition of communications is unsuitable for communications.

5. The apparatus for rewriting a memory in a vehicle mounted ECU through communications according to claim 1, wherein when communications of said subject vehicle are bad, said communications condition determination device determines that the present condition of communications is unsuitable for communications.

6. The apparatus for rewriting a memory in a vehicle mounted ECU through communications according to claim 1, wherein when a starter switch of said subject vehicle is on, said communications condition determination device determines that the present condition of communications is unsuitable for communications.

7. The apparatus for rewriting a memory in a vehicle mounted ECU through communications according to claim 1, wherein said vehicle mounted ECU comprises any of an engine control ECU, a transmission control ECU, a navigation ECU, and an anti-theft ECU, each of which has a memory with upgradable program data stored therein.

8. The apparatus for rewriting a memory in a vehicle mounted ECU through communications according to claim 1, further comprising an information part for notifying, inside said subject vehicle, the execution or completion of the data rewriting by said control means.

9. The apparatus for rewriting a memory in a vehicle mounted ECU through communications according to claim 1, wherein the ID of said vehicle mounted ECU is registered by grouping for each vehicle model.

10. The apparatus according to claim 1, wherein the communications condition determination device determines whether the present condition of communications is suitable for communications with said data communications device based on one of a presence and absence of communication failures which occur during communication.

* * * * *